(12) United States Patent
Akiyama et al.

(10) Patent No.: US 11,235,383 B2
(45) Date of Patent: Feb. 1, 2022

(54) PULSE POWER GENERATING DEVICE

(71) Applicant: MAZDA MOTOR CORPORATION, Hiroshima (JP)

(72) Inventors: Hidenori Akiyama, Koshi (JP); Yuji Hori, Kure (JP)

(73) Assignee: MAZDA MOTOR CORPORATION, Hiroshima (JP)

( * ) Notice: Subject to any disclaimer, the term of this patent is extended or adjusted under 35 U.S.C. 154(b) by 81 days.

(21) Appl. No.: 16/616,414

(22) PCT Filed: May 16, 2018

(86) PCT No.: PCT/JP2018/018987
§ 371 (c)(1),
(2) Date: Nov. 22, 2019

(87) PCT Pub. No.: WO2018/216577
PCT Pub. Date: Nov. 29, 2018

(65) Prior Publication Data
US 2020/0180020 A1    Jun. 11, 2020

(30) Foreign Application Priority Data

May 25, 2017    (JP) .............................. JP2017-103510

(51) Int. Cl.
*B22D 29/00*     (2006.01)
*B08B 3/10*     (2006.01)
(Continued)

(52) U.S. Cl.
CPC .............. *B22D 29/001* (2013.01); *B08B 3/10* (2013.01); *H01T 1/22* (2013.01); *H03K 3/537* (2013.01)

(58) Field of Classification Search
None
See application file for complete search history.

(56) References Cited

U.S. PATENT DOCUMENTS 4,267,481 A *   5/1981   Sauder .................... H01T 13/32
                                                                              313/139
4,490,180 A     12/1984   Prikhodko et al.
(Continued)

FOREIGN PATENT DOCUMENTS

EP        0167687 A1    1/1986
EP        2178181 A1 *   4/2010  ............ F02P 23/045
(Continued)

OTHER PUBLICATIONS

International Search Report issued in PCT/JP2018/018987; dated Aug. 14, 2018.
(Continued)

*Primary Examiner* — Daniel C Puentes
(74) *Attorney, Agent, or Firm* — Studebaker & Brackett PC (57) ABSTRACT

To obtain an impact wave by generation of arc discharge between a high-voltage-side electrode 31 connected to a high-voltage-side terminal of a pulse power generating device and a low-voltage-side electrode 32 grounded or connected to a low-voltage-side terminal of the power source. One of the high-voltage-side electrode 31 or the low-voltage-side electrode 32 is an annular electrode formed in an annular shape, the other electrode is a core electrode arranged inside the annular electrode, and arc discharge is generated between an inner peripheral portion of the annular electrode and an outer peripheral portion of the core electrode.

15 Claims, 11 Drawing Sheets

(51) Int. Cl.
*H01T 1/22* (2006.01)
*H03K 3/537* (2006.01)

(56) References Cited

U.S. PATENT DOCUMENTS

| | | | | |
|---|---|---|---|---|
| 8,063,548 | B2* | 11/2011 | Bishop | H01T 13/20 |
| | | | | 313/141 |
| 2005/0279326 | A1* | 12/2005 | Andersson | F02P 5/06 |
| | | | | 123/406.47 |
| 2010/0072874 | A1* | 3/2010 | Liao | H01T 13/32 |
| | | | | 313/139 |
| 2010/0225222 | A1 | 9/2010 | Bishop | |

FOREIGN PATENT DOCUMENTS

| | | |
|---|---|---|
| EP | 2178181 A1 | 4/2010 |
| JP | S58-009763 A | 1/1983 |
| JP | 2000-213273 A | 8/2000 |
| JP | 2002-204975 A | 7/2002 |
| JP | 2003-064977 A | 3/2003 |
| JP | 2004-137803 A | 5/2004 |
| JP | 2004-181423 A | 7/2004 |
| JP | 2006-150493 A | 6/2006 |
| JP | 2014-168810 A | 9/2014 |

OTHER PUBLICATIONS

Rafailow et al., "Electrohydraulic Cleaning of Castings", GIESSEREI, Apr. 25, 1968, pp. 198-202, vol. 55, No. 9.

* cited by examiner

FIRST EMBODIMENT (HORIZONTAL ELECTRODE TYPE)

SECOND EMBODIMENT (VERTICAL ELECTRODE TYPE)

FIG.10

FIRST EMBODIMENT (HORIZONTAL ELECTRODE TYPE)

FIG.11

SECOND EMBODIMENT (VERTICAL ELECTRODE TYPE)

PULSE POWER GENERATING DEVICE

TECHNICAL FIELD

The present invention relates to a pulse power generating device.

BACKGROUND ART

A pulse power generating device has been known as a device configured to generate arc discharge (pulse discharge) between a high-voltage-side electrode connected to a high-voltage-side terminal of a pulse power source and a low-voltage-side electrode grounded or connected to a low-voltage-side terminal of the power source to obtain an impact wave. The pulse power source is for compressing electric energy in a circuit manner Power obtained by compression of the electric energy in the circuit manner will be referred to as "pulse power."

One example of the pulse power generating device is described in Patent Document 1. The pulse power generating device includes a high-voltage pulse generation source and a pair of electrodes connected to such a power source, and is housed in an insulating tube with tip end portions of both electrodes being exposed. In this example, both electrodes are close to a work immersed in a processing solution, and arc discharge is generated between both electrodes to obtain an impact wave. In this manner, a foreign object or a burr adhering to the work is removed.

CITATION LIST

Patent Document

PATENT DOCUMENT 1: Japanese Unexamined Patent Publication No. 2006-150493

SUMMARY OF THE INVENTION

Technical Problem

The high-voltage-side electrode and the low-voltage-side electrode preferably face each other with a proper interval (e.g., several hundreds of μm to several mm) corresponding to the magnitude of voltage to be applied. However, e.g., a great impact wave of several hundreds of MPa is generated by arc discharge, and therefore, the electrode is deformed due to impact force upon arc discharge as the number of pulse power shots (the number of times of arc discharge) increases. That is, the electrode interval is not constantly held, and is gradually expanded. Thus, desired arc discharge cannot be generated.

In response, in a form in which both electrodes are rod-shaped electrodes having a diameter of about 1 mm and tip ends of these electrodes face each other, an electrode area receiving electrode impact decreases. For this reason, the impact force received by the electrode decreases, but in this case, an increase in the electrode interval with an increase in the number of shots cannot still be avoided.

When both electrodes are supported by an elastic body such as a plate spring and the impact force upon arc discharge is absorbed by the elastic body, electrode durability is enhanced. However, in this case, it is still difficult to withstand, e.g., 10000 arc discharges or more.

In addition to the electrode deformation problem due to the above-described impact force, there is an electrode erosion problem. Arc discharge is generated at a single spot where the interval between the opposing electrodes is narrowest, and therefore, there is a problem that the electrode interval is expanded due to electrode erosion caused by arc discharge and discharge failure is caused. Moreover, there has been a problem that due to discharge at the same spot, erosion progresses to locally damage the electrode and the electrode can be no longer used after a slight number of shots.

For these reasons, the present invention is intended to improve durability of an electrode of a pulse power generating device.

Solution to the Problem

For solving the above-described problems, the present invention is configured such that one electrode is in an annular shape and the other electrode is arranged in such an annular ring.

One aspect of the present invention disclosed herein is a pulse power generating device including a pulse power source, a high-voltage-side electrode connected to a high-voltage-side terminal of the power source, and a low-voltage-side electrode grounded or connected to a low-voltage-side terminal of the power source. The pulse power generating device generates arc discharge between the high-voltage-side electrode and the low-voltage-side electrode to obtain an impact wave in liquid or air.

One of the high-voltage-side electrode or the low-voltage-side electrode is an annular electrode formed in an annular shape, the other one of the high-voltage-side electrode or the low-voltage-side electrode is a core electrode arranged inside the annular electrode, and the arc discharge is generated between an inner peripheral portion of the annular electrode and an outer peripheral portion of the core electrode.

In this device, when a pulse high-voltage is applied to the core electrode and the annular electrode, arc discharge is generated at a single spot (a spot with a narrow electrode interval) between the outer peripheral portion of the core electrode and the inner peripheral portion of the annular electrode, thereby emitting an impact wave. At this point, impact force is applied to the core electrode and the annular electrode. The annular electrode is structurally rigid, whereas the core electrode is cantilever-supported. Thus, tilting of the core electrode from the center position of the annular electrode due to the above-described impact force and elastic return of the core electrode to such a position are repeated in every arc discharge. In this case, the core electrode receives the impact force in the vicinity of the arc discharge generation spot, and therefore, tilts to the opposite side of the arc discharge generation spot.

As the number of pulse power shots increases, the core electrode is plastically deformed, and displacement to the above-described opposite side becomes greater. That is, the interval between the core electrode and the inner peripheral portion of the annular electrode on such an opposite side is narrowed. Accordingly, arc discharge is generated between both electrodes on such an opposite side. As a result, the core electrode receives the impact force on the above-described opposite side. Thus, displacement of the core electrode to the above-described opposite side returns toward the center of the annular electrode.

As clearly seen from above, according to the above-described device configuration, even when the core electrode is displaced in response to the impact force, the arc discharge generation spot is changed, and therefore, a portion receiving the impact force is changed. Thus, displacement returns toward the center of the annular electrode. Thus, even when the number of shots increases, the interval between the core electrode and the annular electrode is not expanded due to electrode deformation, and needless to say, no short circuit is caused between both electrodes.

Moreover, when a spot with a wide interval is formed between the core electrode and the annular electrode due to electrode erosion caused by arc discharge, the arc discharge generation spot moves to a spot with a narrow electrode interval in a circumferential direction of the annular electrode. Thus, the electrode erosion evenly progresses across the entire circumference of the core electrode and the annular electrode. Consequently, even when the number of shots increases, a change in the electrode interval is small, and stable arc discharge can be generated.

The high-voltage-side electrode may be the annular electrode, and the low-voltage-side electrode may be the core electrode. However, the high-voltage-side electrode is preferably the core electrode, and the low-voltage-side electrode is preferably the annular electrode. Thus, even in a case where the low-voltage-side annular electrode electrically contacts a work (a processing target object on which the impact wave acts), arc discharge can be generated between both electrodes.

The above-described core electrode is preferably provided concentrically with the above-described annular electrode, and the form thereof may be a rod-shaped electrode extending straight, a discoid shape, or a spherical shape. In the case of the rod-shaped electrode, it is advantageous in downsizing of an electrode portion including the annular electrode and the core electrode of the pulse power generating device. Thus, in a case where the impact wave is, for example, generated in a small-diameter hole of the work, the electrode portion is easily inserted into the small-diameter hole.

The above-described annular electrode may be a circular shape, a rectangular shape, or other rectangular shapes, but in the case of the circular shape, it is advantageous in downsizing of the electrode portion. For example, an annular discoid shape is preferred.

Alternatively, the above-described annular electrode may be in the shape of a coil formed in such a manner that an electrode wire rod is wound in a spiral shape. In the case of the coil shape, manufacturing is relatively easy, and it is advantageous in improvement of durability of the electrode.

In one embodiment, a rod-shaped support body configured to support the above-described annular electrode and the above-described core electrode is provided, and the center of the above-described annular electrode is oriented in a longitudinal direction of the above-described rod-shaped support body. With this configuration, a strong impact wave can be emitted to the front of the rod-shaped support body in the longitudinal direction thereof (to the front of the annular electrode).

In one embodiment, the rod-shaped support body configured to support the above-described annular electrode and the above-described core electrode is provided, and the center of the above-described annular electrode and the longitudinal direction of the above-described rod-shaped support body are perpendicular to each other. With this configuration, a strong impact wave can be emitted to both sides (both sides of the annular electrode) in a direction perpendicular to the longitudinal direction of the rod-shaped support body.

A flexible portion may be provided at an intermediate portion of the above-described rod-shaped support body. With this configuration, even in a case where a bent portion is present in the hole of the work, the rod-shaped support body is bent at the flexible portion, and the above-described electrode portion is easily inserted into the further back beyond the bent portion of the hole.

In one embodiment of the present invention, the output voltage of the above-described pulse power source is equal to or higher than 20 kV and equal to or lower than 40 kV, the output current is equal to or higher than 3 kA and equal to or lower than 5 kA, the pulse width is equal to or greater than 3 µs and equal to or less than 5 µs, the number of times of output is equal to or greater than 2 pps and equal to or less than 50 pps, and the interval between the above-described high-voltage-side electrode and the above-described low-voltage-side electrode is equal to or greater than 0.2 mm and equal to or less than 3 mm.

The method for removing core sand from a cast product by the above-described pulse power generating device as disclosed herein includes the step of immersing the cast product having the core sand in water, the step of causing the above-described annular electrode and the above-described core electrode of the above-described pulse power generating device to contact or come closer to the core sand of the cast product in the water, and the step of generating pulsed arc discharge between the inner peripheral portion of the above-described annular electrode and the outer peripheral portion of the above-described core electrode to collapse the core sand by the impact wave generated in association with the arc discharge, thereby removing the core sand from the cast product.

According to this method, the impact wave by arc discharge can be stably generated, and the core sand can be efficiently removed from the cast product.

Another aspect of the present invention is a pulse power generating device including a pulse power source and a high-voltage-side electrode connected to a high-voltage-side terminal of the power source. In a hole of a conductive block grounded or connected to a low-voltage-side terminal of the power source, the pulse power generating device generates arc discharge between the high-voltage-side electrode and the conductive block to obtain an impact wave.

The high-voltage-side electrode is in a discoid shape or a circular columnar shape, and at a tip end of a rod-shaped support body, is supported concentrically with the rod-shaped support body, the high-voltage-side electrode is inserted into the hole of the conductive block, and the arc discharge is generated between an inner peripheral portion of the hole and an outer peripheral portion of the high-voltage-side electrode.

In this device, when a high voltage is applied to the high-voltage-side electrode and the conductive block, arc discharge is generated at a single spot (a spot with a narrow interval between both components) between the inner peripheral portion of the hole of the conductive block and the outer peripheral portion of the high-voltage-side electrode, thereby emitting the impact wave. At this point, the high-voltage-side electrode receives the impact force in the vicinity of the arc discharge generation spot. Thus, as the number of shots increases, displacement of the high-voltage-side electrode to the opposite side of the arc discharge generation spot in the above-described hole is caused by the above-described impact force.

When displacement of the high-voltage-side electrode to the above-described opposite side becomes greater and the interval between the high-voltage-side electrode and the inner peripheral portion of the above-described hole on such an opposite side is narrowed, arc discharge is next generated between the high-voltage-side electrode and the inner peripheral portion of the above-described hole on such an opposite side. As a result, the high-voltage-side electrode receives the impact force on the above-described opposite side, and therefore, displacement of the high-voltage-side electrode to the above-described opposite side returns toward the center of the above-described hole.

As clearly seen from above, according to the above-described device configuration, even when the high-voltage-side electrode is displaced in response to the impact force, the arc discharge generation spot is changed, and therefore, the portion receiving the impact force is changed. Thus, displacement returns toward the center of the above-described hole. Thus, even when the number of shots increases, the interval between the outer peripheral portion of the high-voltage-side electrode and the inner peripheral portion of the above-described hole is not expanded due to electrode deformation, and needless to say, no short circuit is caused between the high-voltage-side electrode and the conductive block.

Moreover, when the interval between the high-voltage-side electrode and the inner peripheral portion of the hole of the conductive block is expanded due to electrode erosion, the arc discharge generation spot moves in a circumferential direction of the high-voltage-side electrode. Thus, the electrode erosion evenly progresses across the entire circumference of the high-voltage-side electrode. Consequently, even when the number of shots increases, a change in electrode wear is small, and stable arc discharge can be generated.

According to this aspect, the rod-shaped support body supports only the high-voltage-side electrode, and therefore, it is not necessary to support the low-voltage-side electrode. Thus, an electrode assembly including the high-voltage-side electrode and the rod-shaped support body can be thinned. That is, the electrode assembly is easily downsized so that the electrode assembly can be inserted into a small-diameter hole.

In this aspect, the flexible portion is provided at the intermediate portion of the above-described rod-shaped support body. With this configuration, the high-voltage-side electrode is, together with the rod-shaped support body, easily inserted into the back of the hole having the bent portion.

Advantages of the Invention

According to the present invention, even when the core electrode or the high-voltage-side electrode is displaced in response to the impact force, the arc discharge generation spot is changed, and the portion of the core electrode or the high-voltage-side electrode receiving the impact force is changed. Thus, such displacement returns. Consequently, even when the number of pulse power shots increases, the number of shots can be dramatically increased without causing greater displacement and locally greatly wearing the electrode due to electrode erosion. That is, durability is increased.

DESCRIPTION OF EMBODIMENTS

Hereinafter, an embodiment of the present invention will be described based on the drawings. Description of a preferred embodiment below will be set forth merely as an example in nature, and is not intended to limit application and use thereof.

<Entire Configuration (Use Example)>

Figure 1:
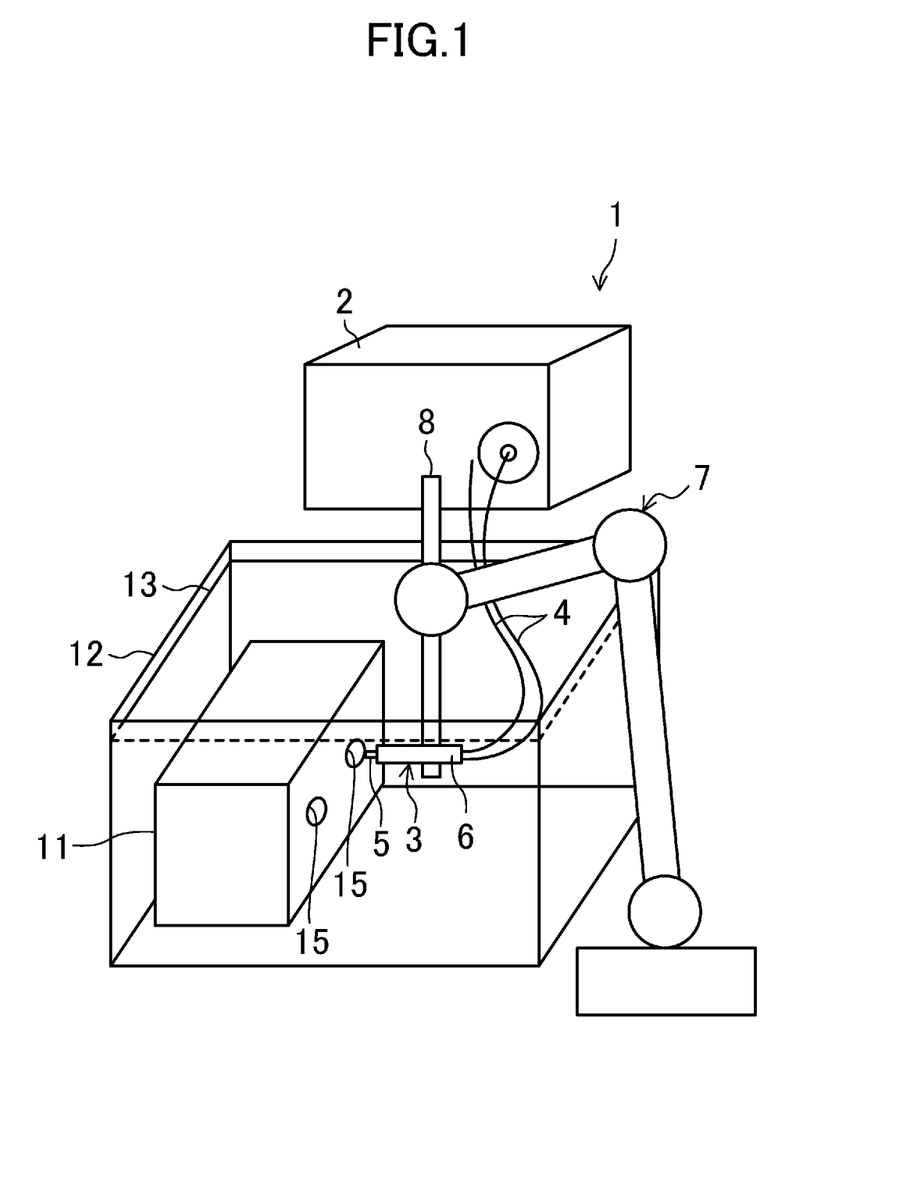
FIG. 1 is a perspective view of a use example of a pulse power generating device.

In a use example (removal of core sand of a cast product 11) of a pulse power generating device 1 illustrated in FIG. 1, 2 indicates a pulse power source, and 3 indicates an electrode assembly connected to the pulse power source 2 through a conductive wire (a power cable) 4. The electrode assembly 3 is configured such that an electrode portion (a high-voltage-side electrode and a low-voltage-side electrode) 5 is supported by a rod-shaped support body 6. The rod-shaped support body 6 is attached to a wrist shaft 8 of a SCARA robot 7.

The cast product 11 from which the core sand needs to be removed is immersed in water of a water tank 12 filled with water 13.

Figure 2A:
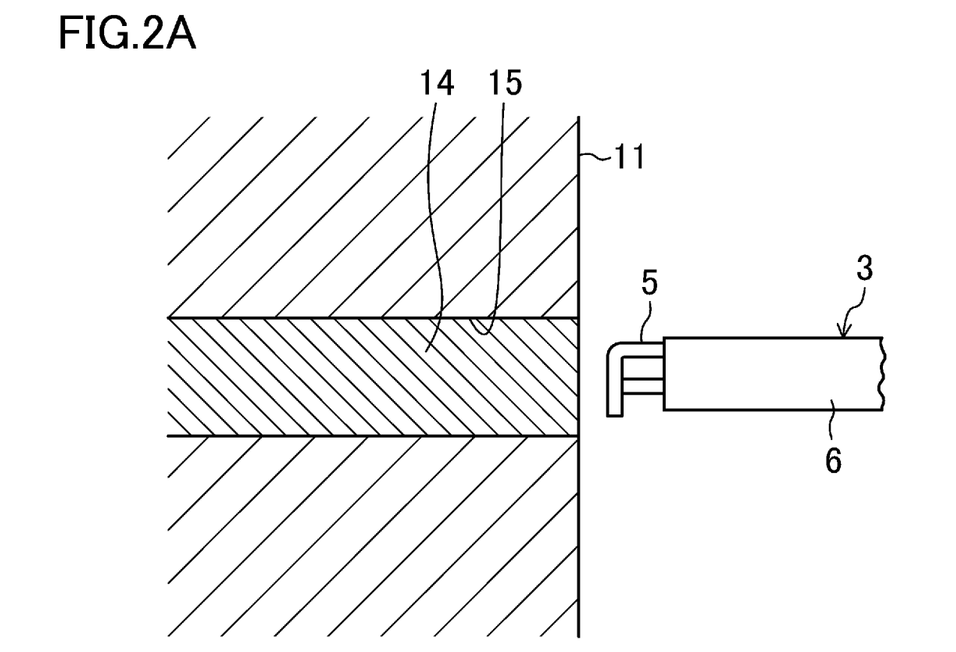
FIGS. 2A and 2B are sectional views for describing the method for removing core sand from a cast product by a pulse power.

As illustrated in FIG. 2(a), upon removal of the core sand 14 of the cast product 11, the electrode portion 5 of the electrode assembly 3 contacts or comes closer to, by actuation of the SCARA robot 7, the core sand 14 inside the cast product 11 through a hole 15 opening at a surface of the cast product 11. In this state, a pulse high-voltage is applied to between the high-voltage-side electrode and the low-voltage-side electrode of the electrode portion 5 by the pulse power source 2, thereby generating pulsed arc discharge between both electrodes. Strong impact force is applied to the core sand 14 by an impact wave generated in association with such arc discharge. Thus, even the core sand 14 using an inorganic binder such as liquid glass as a binder collapses due to the impact force and is easily removed.

Figure 2B:
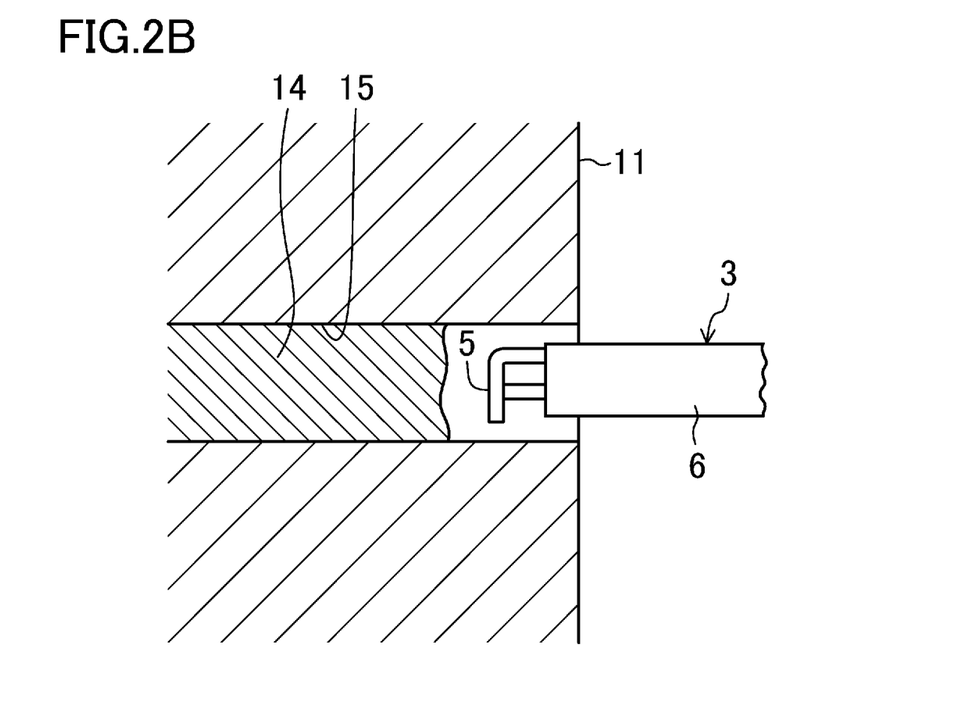

As illustrated in FIG. 2(b), while the core sand 14 is being removed from a near side of the hole 15 by the above-described impact wave, the electrode assembly 3 advances into the back of the hole 15. In this manner, the core sand 14 inside the cast product 11 is removed.

<Pulse Power Generation Power Source>

Figure 3:
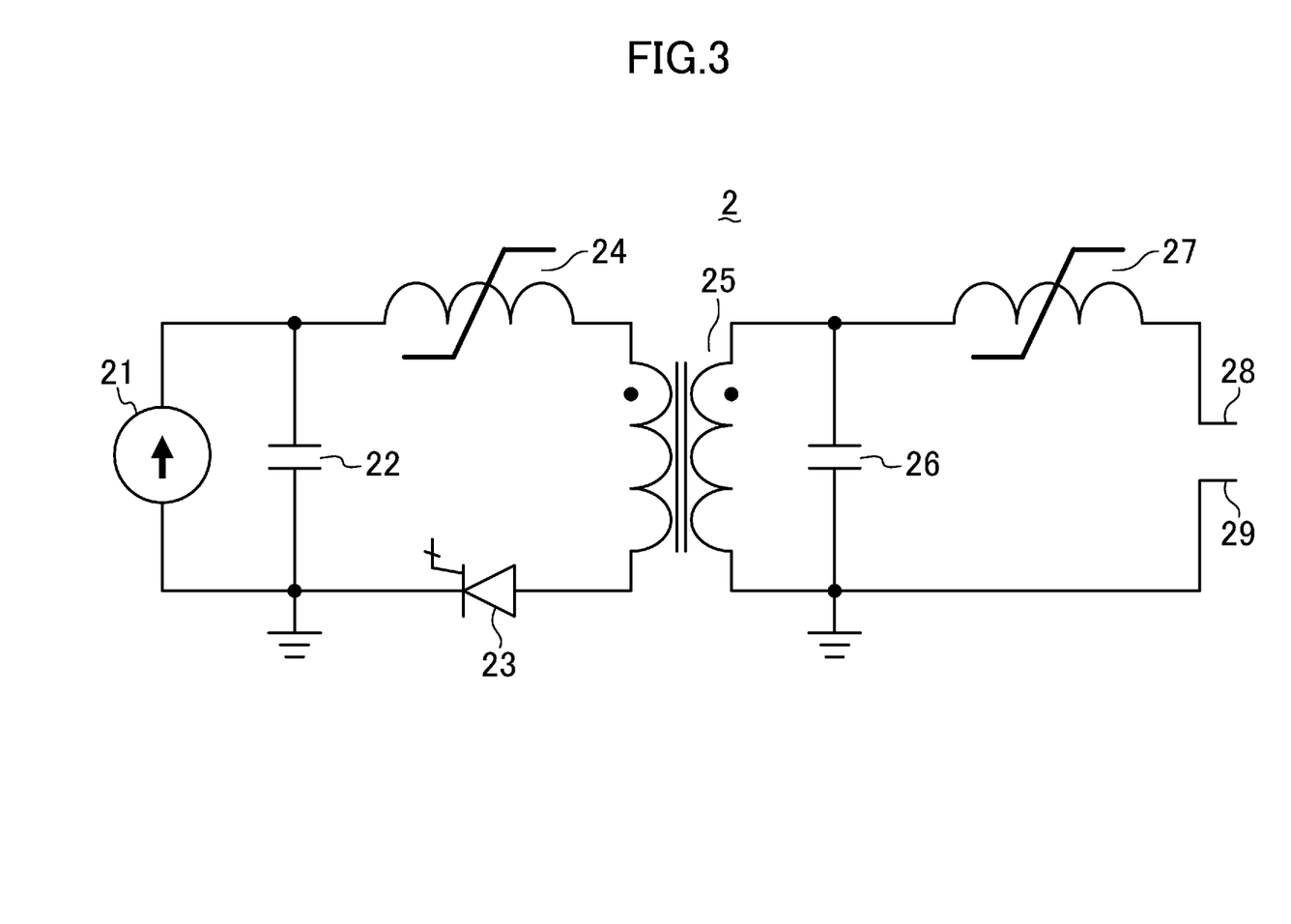
FIG. 3 is a circuit diagram of one example of a pulse power source.

In the pulse power source 2 illustrated as one example in FIG. 3, 21 indicates a current source, 22 indicates an energy storage first capacitor charged by the current source 21, and 23 indicates a semiconductor switch configured to start discharge of the first capacitor 22. 24 indicates a semiconductor switch protection magnetic switch, 25 indicates a boosting transformer, 26 indicates a second capacitor charged with a voltage corresponding to a boosting ratio of the boosting transformer 25 by discharge from the first capacitor 22, and 27 indicates a magnetic switch to be turned ON (saturated) after charging of the second capacitor 26. 28 indicates a high-voltage-side terminal, and 29 indicates a low-voltage-side terminal. The high-voltage-side electrode and the low-voltage-side electrode of the electrode portion 5 are connected to both terminals 28, 29 through the conductive wire 4.

When the semiconductor switch 23 is turned ON after charging of the first capacitor 22, a current is applied from the first capacitor 22 to the second capacitor 26 through the semiconductor switch protection magnetic switch 24 and the boosting transformer 25, and the second capacitor 26 is charged with a high voltage. After such charging, the magnetic switch 27 is turned ON, and a high voltage/current is applied from the output terminal 28 to the conductive wire 4.

By control of a trigger signal to the semiconductor switch 23, an inter-pulse interval and the number of times of output can be controlled. A voltage value of a pulse power can be controlled by control of the charge voltage of the first capacitor 22.

As described above, the pulse power source 2 of the present embodiment employs a magnetic pulse compression method using a highly-repetitive highly-reliable semiconductor switch. Note that a gap switch can be also used as the switch.

Alternatively, the pulse power source 2 of the present embodiment employs a capacitive energy storage method using a capacitor for storage of electric energy, but can also employs an inductive energy storage method using an inductor (a coil) for storage of electric energy.

<Electrode Assembly>

[First Embodiment]

Figure 4:
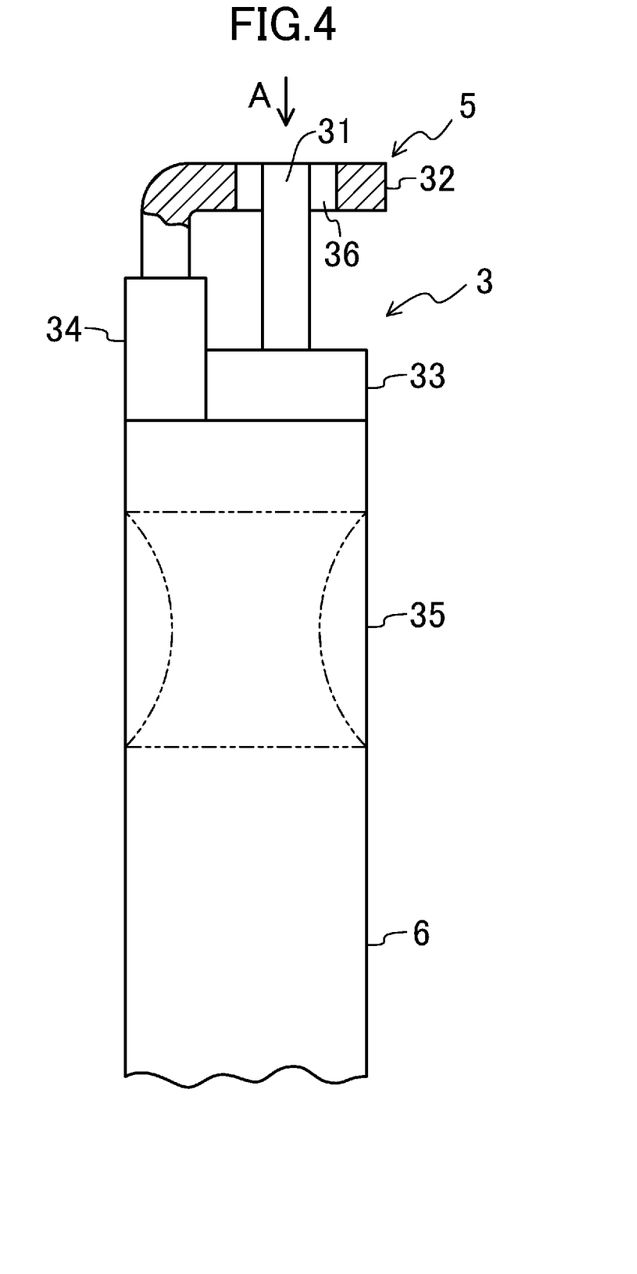
FIG. 4 is a front view of a partial section of an electrode assembly of a first embodiment.
Figure 5:
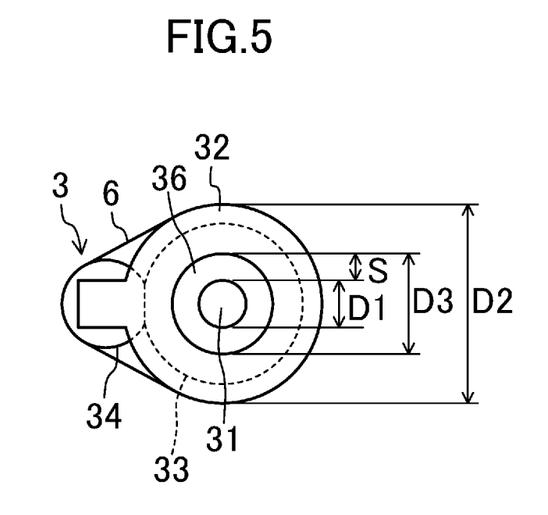
FIG. 5 is a view from an A-direction of FIG. 4.

As illustrated in FIGS. 4 and 5, an electrode assembly 3 includes a high-voltage-side electrode 31 connected to a high-voltage-side terminal 28 of a pulse power source 2, and a low-voltage-side electrode 32 connected (or grounded) to the low-voltage-side terminal 29 of the power source 2. Both electrodes 31, 32 are provided in an electrically-insulating state by insulating coatings 33, 34, and are supported by a rod-shaped support body 6.

The rod-shaped support body 6 is formed by fixing of the insulating coatings 33, 34. At a portion of the rod-shaped support body 6 closer to the electrodes 31, 32, a flexible portion 35 formed by partial strength reduction is provided so that the rod-shaped support body 6 can be elastically bent by external force.

The low-voltage-side electrode 32 of the present embodiment is an annular electrode formed in an annular discoid shape. The high-voltage-side electrode 31 is arranged inside the low-voltage-side electrode 32, i.e., in a hole 36. The high-voltage-side electrode 31 is arranged in a ring of the annular electrode 32, and therefore, will be hereinafter referred to as a "core electrode 31." The high-voltage-side core electrode 31 is formed in the shape of a straight rod having a circular section, and is provided concentrically with the low-voltage-side annular electrode 32.

Thus, the centers of the core electrode 31 and the annular electrode 32 are oriented in a longitudinal direction of the rod-shaped support body 6.

In the above-described electrode assembly 3, when a pulse high-voltage is applied to between the core electrode 31 and the annular electrode 32, arc discharge is generated at a single spot (a spot with the narrowest electrode interval) between an outer peripheral portion of the core electrode 31 and an inner peripheral portion of the annular electrode 32, and an impact wave is emitted circumferentially. At this point, impact force is applied to the core electrode 31 and the annular electrode 32.

In this case, if the number of pulse power shots (the number of times of arc discharge) is great, the cantilever-supported core electrode 31 is displaced by the above-described impact force inside the structurally-rigid annular electrode 32. That is, the core electrode 31 receives the greatest impact force in the vicinity of the arc discharge generation spot, and therefore, is displaced to the opposite side of the arc discharge generation spot. When displacement of the core electrode 31 to the above-described opposite side becomes greater, an interval between the outer peripheral portion of the core electrode 31 on the above-described opposite side and the inner peripheral portion of the annular electrode 32 is narrowed. Thus, arc discharge is generated between both electrodes 31, 32 on the above-described opposite side. As a result, the core electrode 31 next receives the impact force in an opposite direction, and therefore, displacement to the above-described opposite side returns toward the center of the annular electrode 32.

As described above, when the core electrode 31 is displaced in response to the impact force, the arc discharge generation spot is changed accordingly, and as a result, the portion receiving the impact force is changed. Thus, the core electrode 31 is not displaced in a particular direction. That is, displacement of the core electrode 31 returns toward the center of the annular electrode 32. Thus, even when the number of shots increases, the interval between the core electrode 31 and the annular electrode 32 is not expanded due to electrode deformation, and stable arc discharge can be generated. Needless to say, no short circuit is caused between both electrodes 31, 32.

Moreover, when a portion with a wide interval between both electrodes 31, 32 is caused due to electrode erosion due to arc discharge, the arc discharge generation spot moves to a portion with a narrow electrode interval in a circumferential direction of the annular electrode 32. Thus, the electrode erosion evenly progresses across the entire circumference of the core electrode and the annular electrode. For this reason, even when the number of shots increases, a change in the electrode interval is small, and stable arc discharge can be generated.

Further, in the case of the above-described electrode assembly 3, even when there is a bent portion in a hole 15 of a cast product 11 clogged with core sand 14, the rod-shaped support body 6 deflects at the flexible portion 35, and therefore, an electrode portion 5 can advance into the back of the cast product 11 beyond the bent portion. Thus, the core sand 14 in the hole 15 having such a bent portion can be removed.

Although not intended to limit the present invention, the output voltage of the pulse power source 2 can be, for example, equal to or higher than 20 kV and equal to or lower than 40 kV, the output current can be equal to or higher than 3 kA and equal to or lower than 5 kA, the pulse width can be equal to or greater than 3 µs and equal to or less than 5 µs, the number of times of output can be equal to or greater than 2 pps (pulse/second) and equal to or less than 50 pps, and the electrode interval S can be several hundreds of µm to several mm (e.g., equal to or greater than about 0.2 mm and equal to or less than about 3 mm). Moreover, the diameter D1 of the core electrode 31 may be equal to or greater than about 0.5 mm and equal to or less than about 2 mm, the outer diameter D2 of the annular electrode 32 may be equal to or greater than about 3 mm and equal to or less than about 10 mm, and the inner diameter D3 of the annular electrode 32 may be equal to or greater than about 1.5 mm and equal to or less than 6 mm. Such a pulse power source 2 and such an electrode assembly 3 are advantageous in removal of core sand remaining in, e.g., a water jacket of a cylinder head or a cylinder block of an engine.

[Second Embodiment]

Figure 6:
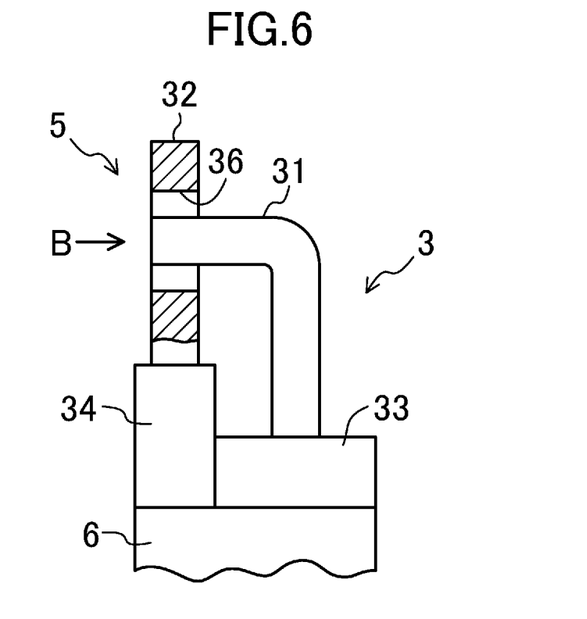
FIG. 6 is a front view of a partial section of an electrode assembly of a second embodiment.
Figure 7:
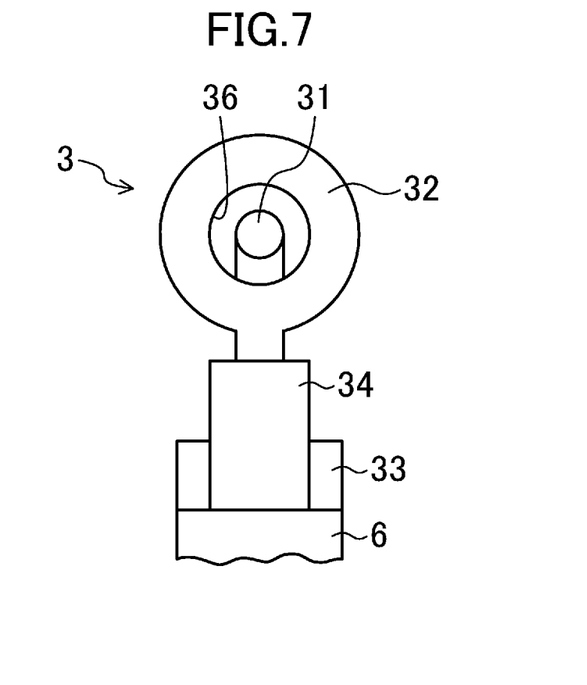
FIG. 7 is a view from a B-direction of FIG. 6.

As illustrated in FIGS. 6 and 7, an electrode assembly 3 of the present embodiment is, unlike the first embodiment, configured such that the center of each of a core electrode 31 and an annular electrode 32 is perpendicular to a longitudinal direction of a rod-shaped support body 6. Other configurations are the same as those of the first embodiment.

In the present embodiment, even when the number of shots increases, the core electrode 31 is, as in the first embodiment, constantly positioned at the center of the annular electrode 32 without expanding an electrode interval and causing short circuit between both electrodes 31, 32, and advantageous effects that a change in the electrode interval due to electrode erosion is small and stable arc discharge can be generated are provided.

(Angle Dependence of Impact Wave Intensity)

Figure 8:
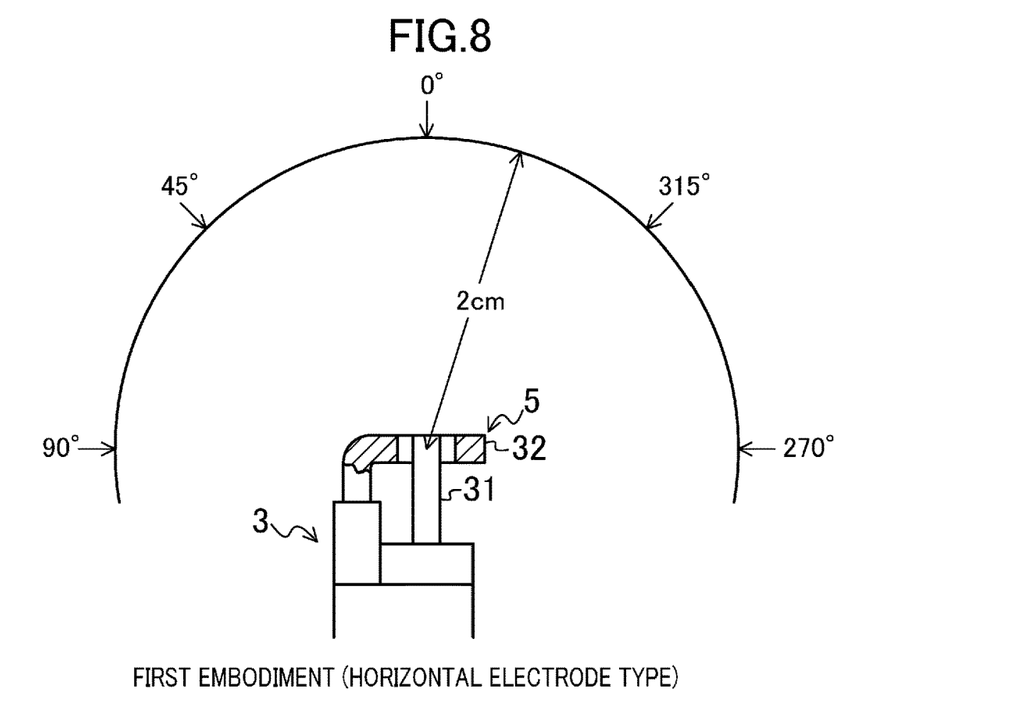
FIG. 8 is a view of, e.g., a measurement direction of impact wave intensity according to the first embodiment.
Figure 9:
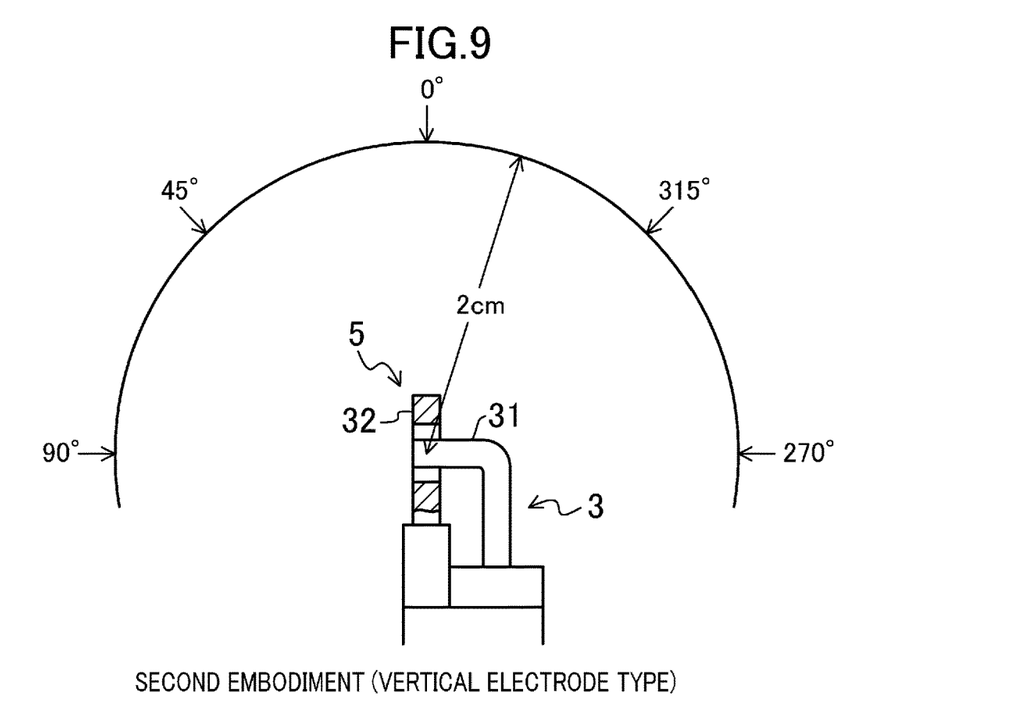
FIG. 9 is a view of, e.g., a measurement direction of impact wave intensity according to the second embodiment.

As described above, the first and second embodiments are different from each other in the orientations of the electrodes 31, 32. For this reason, study has been conducted on influence (angle dependence of impact wave intensity) of such an electrode orientation difference on directionality of the impact wave intensity. That is, as illustrated in FIGS. 8 and 9, the impact wave intensity at a position apart from the center of the electrode portion 5 of each of the first and second embodiments by 2 cm in each direction was measured by an optical fiber probe hydrophone FOPH2000 (a water pressure measurement instrument) manufactured by RP Acoustics.

Figure 10:
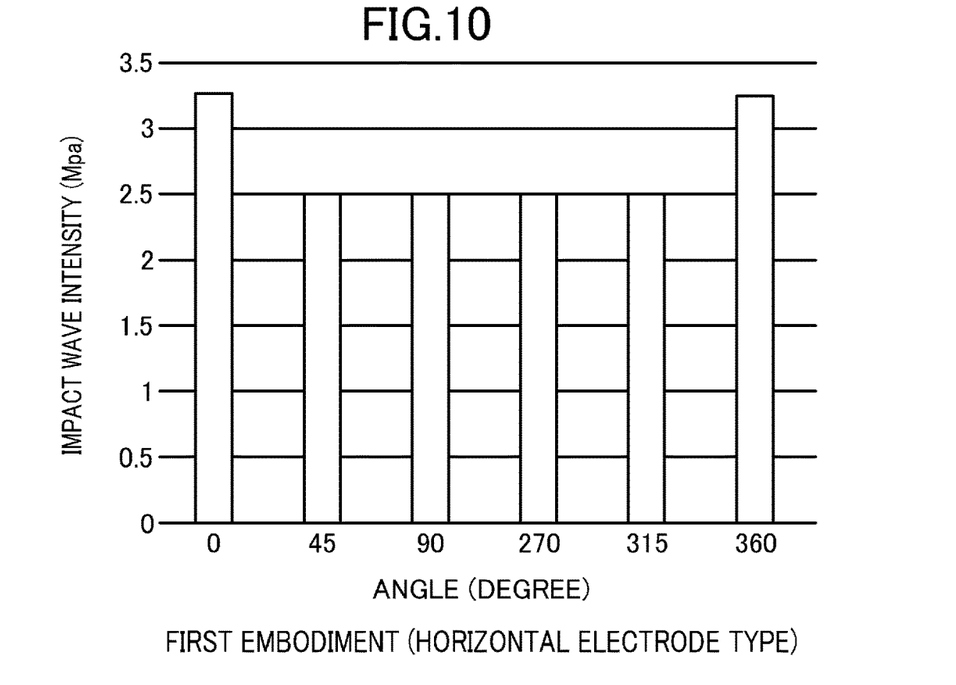
FIG. 10 is a graph of angle dependence of the impact wave intensity according to the first embodiment.
Figure 11:
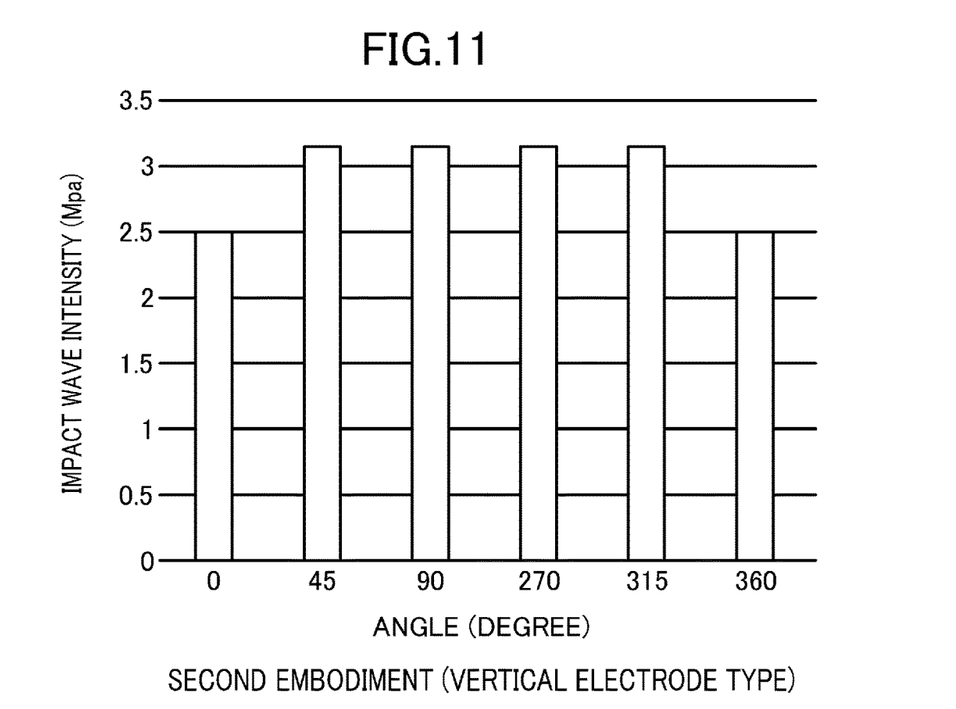
FIG. 11 is a graph of angle dependence of the impact wave intensity according to the second embodiment.

In any of the first and second embodiments, the diameter D1 of the core electrode 31 is 1.5 mm, the outer diameter D2 of the annular electrode 32 is 5 mm, the inner diameter D3 of the annular electrode 32 is 2.5 mm, and the electrode interval S is 0.5 mm. Moreover, an output voltage is 20 kV, an output current is 4 kA, and a pulse width is 4 μs. Results are shown in FIGS. 10 and 11.

An electrode structure in which the center of each of the core electrode 31 and the annular electrode 32 extends in the longitudinal direction of the rod-shaped support body 6 as in the first embodiment will be referred to as a "horizontal electrode type," and an electrode structure in which the center of each of the core electrode 31 and the annular electrode 32 is perpendicular to the longitudinal direction of the rod-shaped support body 6 as in the second embodiment will be referred to as a "vertical electrode type."

According to these figures, in the first embodiment (the horizontal electrode type), the impact wave intensity to the front of the electrode portion 5 of the electrode assembly 3 is high. On the other hand, in the second embodiment (the vertical electrode type), the impact wave intensity in directions (a direction perpendicular to the longitudinal direction of the rod-shaped support body) to both sides of the electrode portion 5 of the electrode assembly 3 is high.

Thus, it is shown that in the case of the first embodiment (the horizontal electrode type), the ability of collapsing the core sand 14 in the front in an insertion direction of the electrode assembly 3 when the electrode assembly 3 is inserted into the hole 15 of the cast product 11 is high.

Figure 12:
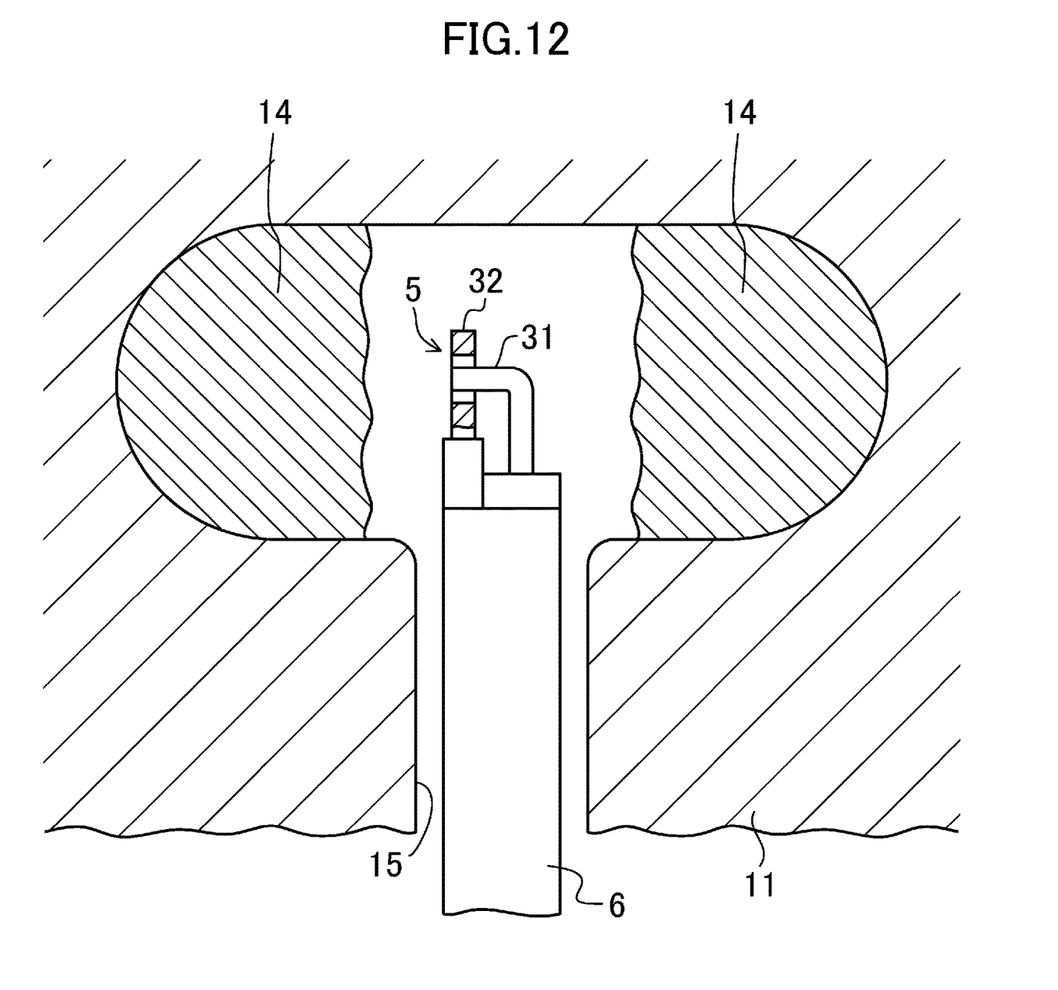
FIG. 12 is a section of a form for removing core sand by the electrode assembly of the second embodiment.

On the other hand, the impact wave intensity in the directions to both sides of the electrode portion 5 is high in the second embodiment (the vertical electrode type), and therefore, in a case where the back of a hole 15 of a cast product 11 is, for example, enlarged as illustrated in FIG. 12, core sand 14 at corners in the back of the cast product 11 easily collapses. Moreover, when the electrode assembly 3 is rotated about the axis of the rod-shaped support body 6 in the longitudinal direction thereof, the core sand 14 in the enlarged back of the hole 15 can collapse across every corner of the hole 15.

[Third Embodiment]

Figure 13:
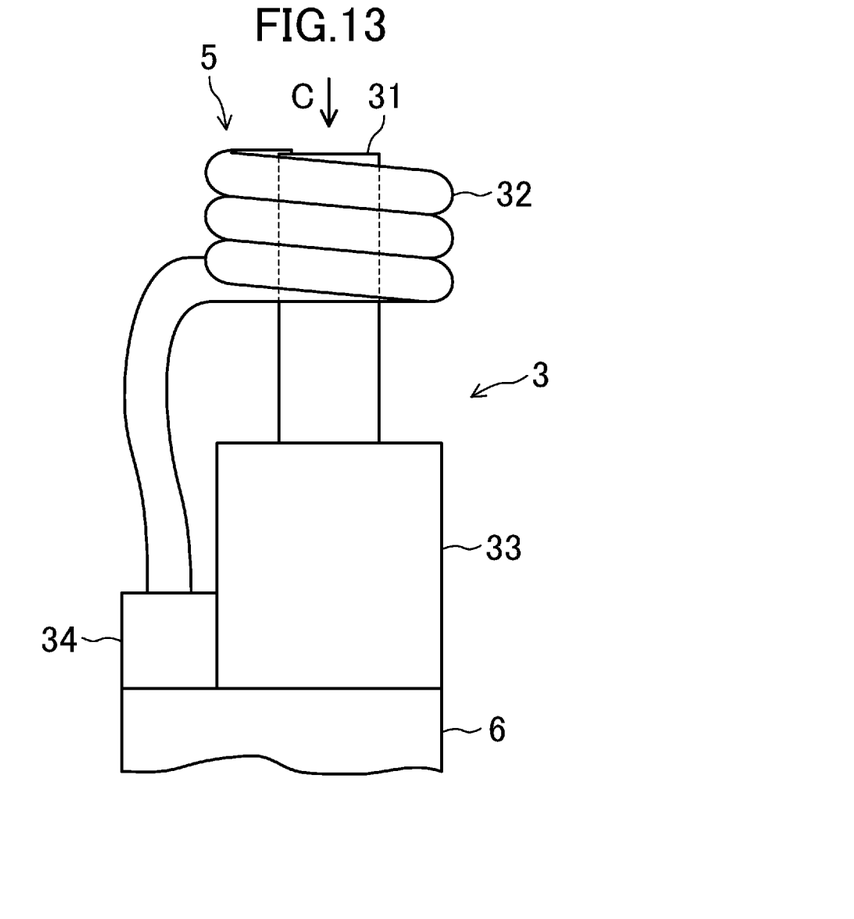
FIG. 13 is a front view of an electrode assembly of a third embodiment.
Figure 14:
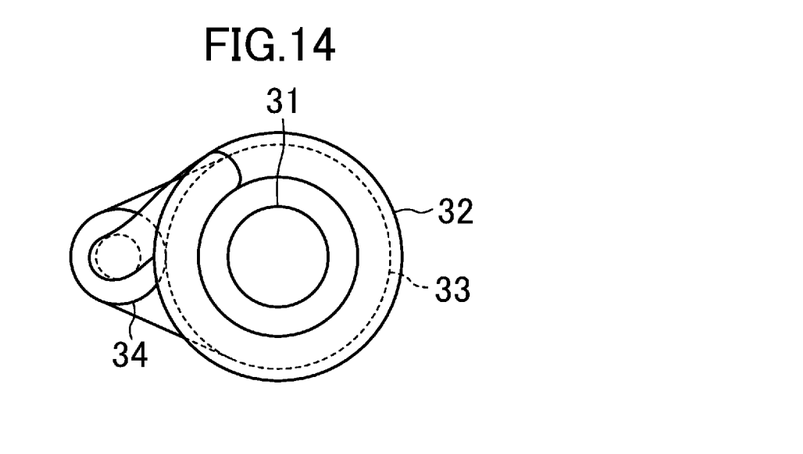
FIG. 14 is a view from a C-direction of FIG. 13.

As illustrated in FIGS. 13 and 14, an electrode assembly 3 of the present embodiment is, unlike the previously-described first and second embodiments, characterized in that an annular electrode 32 is in the shape of a coil formed in such a manner that an electrode wire rod is wound multiple times in a spiral shape to form a cylindrical shape. A core electrode 31 is formed in the shape of a straight rod having a circular section as in the first embodiment, and is provided concentrically with the coil-shaped annular electrode 32. Other configurations are the same as those of the first embodiment.

In the present embodiment, even when the number of shots increases, the core electrode 31 is, as in the first and second embodiments, constantly positioned at the center of the annular electrode 32 without expanding an electrode interval and causing short circuit between both electrodes 31, 32, and advantageous effects that a change in the electrode interval due to electrode erosion is small and stable arc discharge can be generated are provided.

Moreover, when a coil portion of the annular electrode 32 generating arc discharge and a portion of the core electrode 31 corresponding to such a coil portion become thinner due to erosion, an arc discharge location moves to an adjacent coil portion, and therefore, stable arc discharge can be generated even when the number of shots increases. That is, durability of an electrode portion 5 is high. According to an experiment, even when the number of shots exceeds one hundred thousand, no noticeable change in impact wave intensity has been found.

An example of FIGS. 13 and 14 shows a horizontal electrode type as in the first embodiment, but the present embodiment can be applied to a vertical electrode type as in the second embodiment.

[Fourth Embodiment]

Figure 15:
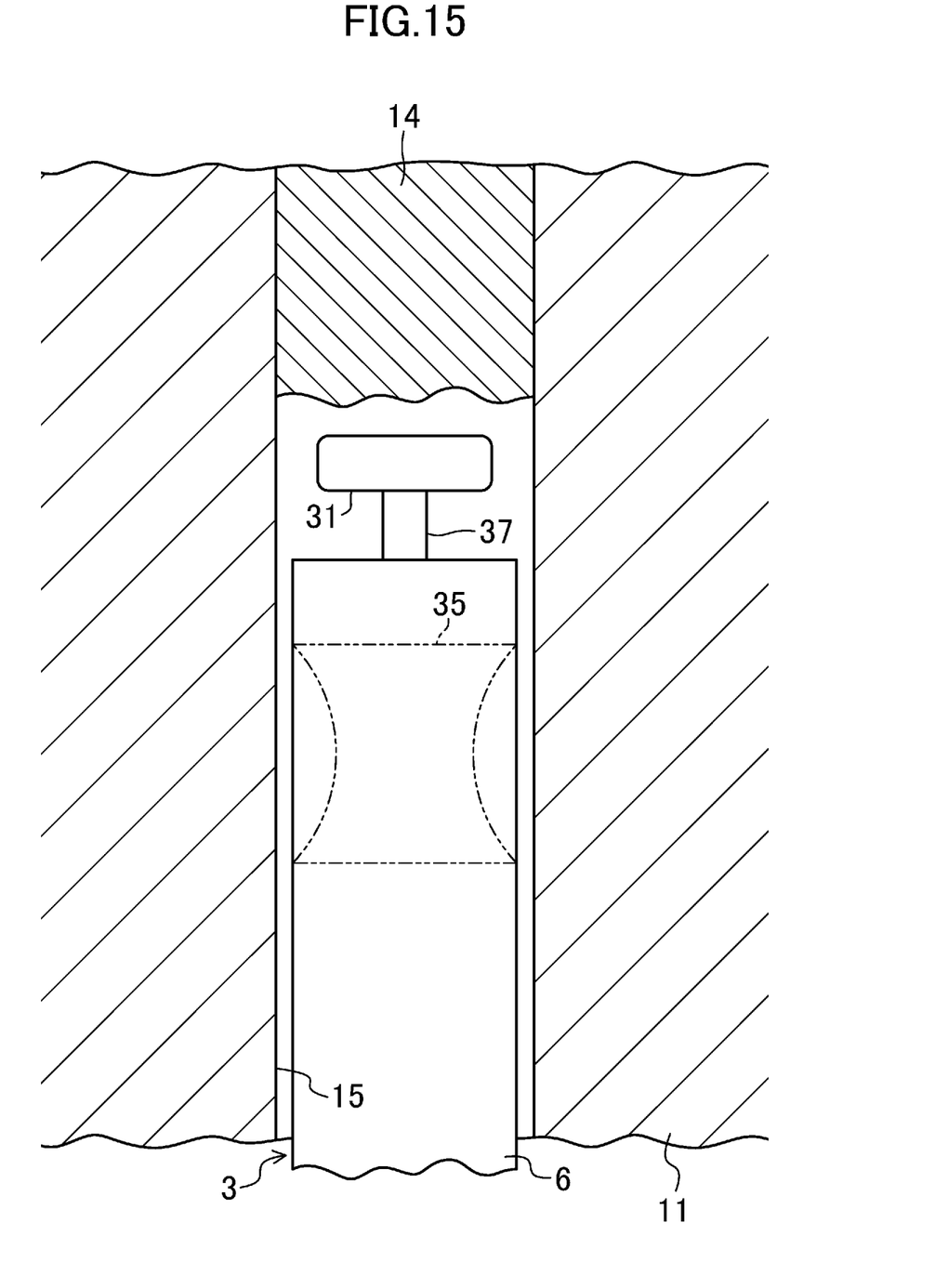
FIG. 15 is a section of a form for removing core sand by an electrode assembly of a fourth embodiment.

As illustrated in FIG. 15, an electrode assembly 3 of the present embodiment is configured such that a high-voltage-side electrode 31 connected to a high-voltage-side terminal 28 of a pulse power source 2 is supported by a rod-shaped support body 6 through a conductive shaft 37. The high-voltage-side electrode 31 has a discoid shape or a circular columnar shape, and is provided concentrically with the rod-shaped support body 6. The diameter of the high-voltage-side electrode 31 is smaller than the diameter of the rod-shaped support body 6.

The high-voltage-side electrode 31 is inserted into a hole 15 of a cast product 11 as a conductive block grounded or connected to a low-voltage-side terminal 29 of the pulse power source 2. Then, arc discharge is generated between an inner peripheral portion of the hole 15 of the cast product 11 and an outer peripheral portion of the high-voltage-side electrode 31. In this manner, an impact wave is obtained to collapse core sand 14. At a portion of the rod-shaped support body 6 closer to the high-voltage-side electrode 31, a flexible portion 35 formed by partial strength reduction is provided so that the rod-shaped support body 6 can be elastically bent by external force.

In the present embodiment, when a high voltage is applied to between the high-voltage-side electrode 31 and the cast product 11, arc discharge is generated at a single spot (a spot with a narrower interval between these components) between the inner peripheral portion of the hole 15 of the cast product 11 and the outer peripheral portion of the high-voltage-side electrode 31, and an impact wave is emitted. At this point, the high-voltage-side electrode 31 receives impact force in the vicinity of the arc discharge generation spot. As the number of shots increases, the cantilever-supported high-voltage-side electrode 31 is displaced to the opposite side of the arc discharge generation spot by the above-described impact force inside the hole 15.

In the case of the present embodiment, when displacement of the high-voltage-side electrode 31 to the above-described opposite side becomes greater, an interval between the outer peripheral portion of the high-voltage-side electrode 31 on the above-described opposite side and the inner peripheral portion of the hole 15 is narrowed as in the previously-described embodiments, and therefore, arc discharge is generated on such an opposite side. As a result, the high-voltage-side electrode 31 next receives the impact force in an opposite direction, and therefore, displacement to the above-described opposite side returns toward the center of the hole 15. Thus, even when the number of shots increases, the interval between the outer peripheral portion of the high-voltage-side electrode 31 and the inner peripheral portion of the hole 15 is not expanded. Moreover, the high-voltage-side electrode 31 and the rod-shaped support body 6 are provided concentrically, and the diameter of the high-voltage-side electrode 31 is smaller than the diameter of the rod-shaped support body 6. Thus, an outer peripheral portion of the rod-shaped support body 6 contacts the inner peripheral portion of the hole 15 in the hole 15 of the cast product 11, and short circuit of the high-voltage-side electrode 31 in the cast product 11 is avoided.

Moreover, when the interval between the high-voltage-side electrode 31 and the inner peripheral portion of the hole 15 of the cast product 11 is expanded due to electrode erosion, the arc discharge generation spot moves in a circumferential direction of the high-voltage-side electrode 31. Thus, the electrode erosion evenly progresses across the entire circumference of the high-voltage-side electrode 31. For this reason, even when the number of shots increases, a change in electrode wear is small, and stable arc discharge can be generated.

According to the present embodiment, the rod-shaped support body 6 supports only the high-voltage-side electrode 31, and therefore, the electrode assembly 3 can be thinned That is, the electrode assembly 3 is easily downsized so that the electrode assembly 3 can be inserted into the small-diameter hole 15 of the cast product 11.

Moreover, the flexible portion 35 is provided at an intermediate portion of the rod-shaped support body 6, and therefore, the high-voltage-side electrode 31 is, together with the rod-shaped support body 6, easily inserted into the back of the hole 15 having a bent portion.

Note that the above-described first to fourth embodiments relate to the electrode assembly used for removal of the core sand, but the present invention is not limited to above and is applicable to pulse power generating devices for various purposes.

DESCRIPTION OF REFERENCE CHARACTERS

1 Pulse Power Generating Device
2 Pulse Power Generation Power Source
3 Electrode Assembly
5 Electrode Portion
6 Rod-Shaped Support Body
11 Cast Product (Conductive Block)
12 Water Tank
14 Core Sand
15 Hole
28 High-Voltage-Side Terminal
29 Low-Voltage-Side Terminal
31 High-Voltage-Side Electrode (Core Electrode)
32 Low-Voltage-Side Electrode (Annular Electrode)
35 Flexible Portion

The invention claimed is:

1. A pulse power generating device comprising:
a pulse power source;
a high-voltage-side electrode connected to a high-voltage-side terminal of the power source; and
a low-voltage-side electrode grounded or connected to a low-voltage-side terminal of the power source,
wherein the pulse power generating device generates arc discharge between the high-voltage-side electrode and the low-voltage-side electrode to obtain an impact wave,
one of the high-voltage-side electrode or the low-voltage-side electrode is an annular electrode formed in an annular shape,
the other one of the high-voltage-side electrode or the low-voltage-side electrode is a core electrode arranged inside the annular electrode,
the annular electrode is an electrode wire wound in a spiral shape such that the winding makes contact with itself, and
the pulse power source applies a high voltage/current to the high-voltage-side terminal to generate the arc discharge between an inner peripheral portion of the annular electrode and an outer peripheral portion of the core electrode.

2. The pulse power generating device according to claim 1, wherein
the core electrode is formed in a shape of a straight rod concentric with the annular electrode.

3. The pulse power generating device according to claim 1, further comprising:
a rod-shaped support body configured to support the annular electrode and the core electrode,
wherein a center of the annular electrode is oriented in a longitudinal direction of the rod-shaped support body.

4. The pulse power generating device according to claim 3, wherein
the rod-shaped support body has a flexible portion at an intermediate portion thereof.

5. The pulse power generating device according to claim 1, further comprising:
a rod-shaped support body configured to support the annular electrode and the core electrode,
wherein a center of the annular electrode and a longitudinal direction of the rod-shaped support body are perpendicular to each other.

6. The pulse power generating device according to claim 5,
wherein the rod-shaped support body has a flexible portion at an intermediate portion thereof.

7. A method for removing core sand from a cast product by the pulse power generating device according to claim 1, comprising:
a step of immersing the cast product having the core sand in water;

a step of causing the annular electrode and the core electrode of the pulse power generating device to contact or come closer to the core sand of the cast product in the water; and a step of generating pulsed arc discharge between the inner peripheral portion of the annular electrode and the outer peripheral portion of the core electrode to collapse the core sand by the impact wave generated in association with the arc discharge, thereby removing the core sand from the cast product.

8. A pulse power generating device comprising:

a pulse power source;

a high-voltage-side electrode connected to a high-voltage-side terminal of the power source; and a low-voltage-side electrode grounded or connected to a low-voltage-side terminal of the power source, wherein the pulse power generating device generates arc discharge between the high-voltage-side electrode and the low-voltage-side electrode to obtain an impact wave, one of the high-voltage-side electrode or the low-voltage-side electrode is an annular electrode formed in an annular shape, the other one of the high-voltage-side electrode or the low-voltage-side electrode is a core electrode arranged inside the annular electrode, an output voltage of the pulse power source is equal to or higher than 20 kV and equal to or lower than 40 kV, an output current is equal to or higher than 3 kA and equal to or lower than 5 kA, a pulse width is equal to or greater than 3 µs and equal to or less than 5 µs, the number of times of output is equal to or greater than 2 pps and equal to or less than 50 pps, and an interval between the high-voltage-side electrode and the low-voltage-side electrode is equal to or greater than 0.2 mm and equal to or less than 3 mm, and the pulse power source applies a high voltage/current to the high-voltage-side terminal to generate the arc discharge between an inner peripheral portion of the annular electrode and an outer peripheral portion of the core electrode.

9. The pulse power generating device according to claim 8, wherein the core electrode is formed in a shape of a straight rod concentric with the annular electrode.

10. The pulse power generating device according to claim 8, wherein the annular electrode is in an annular discoid shape.

11. The pulse power generating device according to claim 8, wherein the annular electrode is in a shape of a coil formed in such a manner that an electrode wire rod is wound in a spiral shape.

12. The pulse power generating device according to claim 8, further comprising:

a rod-shaped support body configured to support the annular electrode and the core electrode, wherein a center of the annular electrode is oriented in a longitudinal direction of the rod-shaped support body.

13. The pulse power generating device according to claim 12, wherein the rod-shaped support body has a flexible portion at an intermediate portion thereof.

14. The pulse power generating device according to claim 8, further comprising:

a rod-shaped support body configured to support the annular electrode and the core electrode, wherein a center of the annular electrode and a longitudinal direction of the rod-shaped support body are perpendicular to each other.

15. The pulse power generating device according to claim 14, wherein the rod-shaped support body has a flexible portion at an intermediate portion thereof.

\* \* \* \* \*